(12) United States Patent
Ong

(10) Patent No.: US 7,501,819 B2
(45) Date of Patent: Mar. 10, 2009

(54) MEASUREMENT APPARATUS AND METHOD

(75) Inventor: Joo Tim Ong, Aberdeen (GB)

(73) Assignee: Baker Hughes Incorporated, Houston, TX (US)

( * ) Notice: Subject to any disclaimer, the term of this patent is extended or adjusted under 35 U.S.C. 154(b) by 36 days.

(21) Appl. No.: 11/233,900

(22) Filed: Sep. 23, 2005

(65) Prior Publication Data

US 2006/0071661 A1    Apr. 6, 2006

(30) Foreign Application Priority Data

Sep. 24, 2004  (GB) ................................. 0421266.8

(51) Int. Cl.
*G01V 3/00* (2006.01)
(52) U.S. Cl. ...................................... 324/306; 324/322
(58) Field of Classification Search .................. 324/306
See application file for complete search history.

(56) References Cited

U.S. PATENT DOCUMENTS

| | | | |
|---|---|---|---|
| 4,785,245 A | 11/1988 | Lew et al. | 324/308 |
| 4,901,018 A | 2/1990 | Lew | |
| 5,684,399 A * | 11/1997 | Bayer | 324/306 |
| 6,046,587 A | 4/2000 | King et al. | 324/306 |

FOREIGN PATENT DOCUMENTS

| | | |
|---|---|---|
| EP | 0496330 | 1/1992 |
| EP | 0 691 526 A1 | 1/1996 |
| WO | WO 98/59220 | 12/1998 |
| WO | WO 01/36919 A1 | 5/2001 |

* cited by examiner

*Primary Examiner*—Louis M. Arana
(74) *Attorney, Agent, or Firm*—Madan, Mossman & Sriram, P.C.

(57) ABSTRACT

The invention relates to a method of determining the flow characteristics of a multiphase fluid along a flow path. The method involves applying a primary magnetic field to the flow of fluid in order to align the nuclei of the flow with the direction of this magnetic field, imparting a radio frequency on the flow in order to excite its nuclei and receiving a radio frequency emitted by the excited nuclei in order to obtain a Nuclear Magnetic Resonance (NMR) signal alternating between a phase ratio mode and a phase flow mode. The phase ratio mode involves processing the received radio frequency in order to determine the ratio of one phase with respect to another phase in the flow. The phase flow mode involves applying a secondary magnetic field in the region of the fluid flow which varies in magnitude along the length of the fluid flow path in order to provide a variation in the magnetic field experienced by the nuclei of the fluid flow dependent upon their position along the fluid flow path. This allows the velocity of the fluid flow to be calculated. Measurement apparatus for measuring the phase fraction and flow rate of phases present in fluid flow path is also provided.

30 Claims, 14 Drawing Sheets

MEASUREMENT APPARATUS AND METHOD

This application claims priority from United Kingdom patent application No. 0421266.8, filed on 24 Sep. 24, 2004, which is hereby incorporated by reference.

BACKGROUND OF THE INVENTION

FIELD OF THE INVENTION

The present invention relates to a measurement apparatus and method and particularly but not exclusively relates to a measurement apparatus and method used to measure flow rate and phase fraction properties of fluid flow in the oil and gas exploration and production industry.

In the oil and gas industry it has become increasingly important in recent years to obtain accurate measurements of the flow rate and phase ratio of multiphase fluids such as those produced by drilling operations.

In order to measure the flow rate and ratio properties of such multiphase fluids accurately enough to satisfy the operator's requirements it is currently known to use techniques such as Nuclear Magnetic Measurement (NMR) and Electronic Spin Resonance (ESR) analysis. However, currently available systems for measuring such properties using these techniques require a number of separate components which employ a variety of operational and analytical techniques and often involve a number of discrete devices each adapted to measure a particular property of the fluid flow. For example a device for detecting the fraction of one phase may be supplied along with a device for detecting the fraction of another phase and another device to measure the overall flow rate.

SUMMARY OF THE INVENTION

According to the present invention there is provided a method of determining the flow characteristics of a multiphase fluid along a flow path comprising the steps of:

imparting a primary magnetic field on the multiphase flow in order to align the nuclei of the multiphase flow with the direction of the primary magnetic field;

imparting a radio frequency on the multiphase flow in order to excite the nuclei of the multiphase flow;

receiving a radio frequency emitted by the excited nuclei in order to measure the Nuclear Magnetic Resonance (NMR) signal;

alternating between one of a phase ratio mode comprising processing the received radio frequency in order to determine the ratio of at least one phase with respect to another phase in the multiphase flow, and a phase flow mode comprising selectively imparting a secondary magnetic field in the region of the fluid flow which varies in magnitude along the length of the fluid flow path in order to provide a variation in the magnetic field experienced by the nuclei of the fluid flow dependent upon their position along the fluid flow path such that the velocity of the fluid flow may be calculated.

Typically, the method comprises detecting the flow characteristics of hydrocarbon flow, typically in the hydrocarbon exploration and production industry.

Typically, the radio frequency is imparted on the multiphase flow by a transmission coil. Typically, the radio frequency emitted by the excited nuclei is received using a reception coil. Preferably, the transmission radio frequency imparted on the multiphase flow and the radio frequency emitted by the excited nuclei is respectively transmitted and received by a combined reception and transmission coil.

Typically, the frequency imparted on the multiphase flow is transmitted at a frequency which is known to excite the nuclei of the phases of the fluid flow of interest.

Preferably, the method further comprises the step of distinguishing peaks caused in the NMR spectrum by the radio frequency emitted by the nuclei of two or more phases of the multiphase fluid.

Preferably, the method further comprises the step of numerically integrating the area under the or each peak of the NMR spectrum for the or each phase of the fluid in order to ascertain the proton density of the or each phase in the fluid flow.

Preferably, the method further comprises the step of calculating the volume fraction (V) of the or each phase using the proton density measurement of the or each phase in the fluid flow in accordance with the following equation:

$$V = \frac{MW_s}{\rho_s} \times \frac{1}{Av} \times \frac{PD}{\alpha R_{1H}}$$

where $MW_s$ is the molecular weight, $\rho_s$ is the density of the sample, $Av$ is the Avogadro number, $PD$ is the proton density, $a$ is the natural abundance of $^1H$ and $R_1H$ is the number of $^1H$ for 1 molecule of the or each phase.

Optionally, the method further comprises the step of calculating the proton density for the or each phase comprising the fluid flow using the following equation:

$$\frac{V_1}{\sum_{i=1}^{n} V_i} = \frac{\frac{MW_1}{\rho_1} \times \frac{PD_1}{R_{1Hi}}}{\sum_{i=1}^{n} \left(\frac{MW_i}{\rho_i} \cdot \frac{PD}{R_{1Hi}}\right)}$$

where n is the number of phases present in the flow.

The density values for the phases in the fluid flow may be obtained using typical well fluid sampling techniques or through correlation with the relaxation time measurement.

This allows the volume fraction of the hydrocarbon phases, such as oil and gas, to be determined with respect to the non hydrocarbon phases, such as water. The fraction of each phase making up the hydrocarbon phase may now be determined.

Preferably, the method further comprises the step of determining the relaxation times of the nuclei of each phase of the hydrocarbon phase in order to determine the fraction of each phase comprising the hydrocarbon phase. Typically, the method of determining the relaxation times involves monitoring the time taken for the magnitude of the radio frequency received from the nuclei to reach a maximum value in the direction of the primary magnetic field and preferably comprises the step of monitoring the time taken for the magnitude of the radio frequency received from the nuclei to decay to a minimum value in a direction orthogonal to the primary magnetic field.

Preferably, the method of monitoring the direction in which the radio frequency is received from the nuclei is performed using reception coils which are adapted to be able to detect the component of the radio frequency emitted from the nuclei in the longitudinal and transverse directions with respect to the magnetic field direction of the primary magnet.

Preferably, the method further comprises the step of selectively imparting a gradient echo sequence on the fluid flow path in order to determine the flow rate of each phase in the fluid flow path as a result of detecting the accumulated phase shifts caused by the variated magnetic field provided by the secondary magnetic field.

Preferably, accumulation of the phase shifts is calculated using the following equation:

$$\phi = \gamma B_0 \int dt + \gamma \int x(t) G_x(t) dt$$

where $\gamma$ is the gyromagnetic ratio of the nucleus and $B_0$ is the magnetic field produced by the primary magnet.

Preferably, the gradient echo sequence is imparted on the fluid flow path using the combined reception and transmission coil.

Preferably, the gradient echo sequence is pulsed at a rate which allows the relaxation times of the nuclei of each phase to be determined in a length of time which is less than or equal to the length of time taken by the flow to transit through the flow path.

According to the present invention there is also provided combined phase fraction and flow rate apparatus having a fluid flow path there through, the combined phase fraction and flow rate apparatus comprising:

a primary magnet capable of imparting a magnetic field in the region of the fluid flow path;

a secondary magnet capable of imparting on the fluid flow a magnetic field which may vary in magnitude along the length of the fluid flow path;

a radio frequency transmitter adapted to impart a radio signal in the region of the fluid flow path;

a radio frequency receiver adapted to receive a radio frequency from fluid present in the fluid flow path such that the phase fraction and flow rate of phases present in the fluid flow path may be determined.

Preferably, the flow path comprises a through bore through the apparatus having an inlet at one end and an outlet at the other, which is preferably in fluid communication, on both ends of the through bore, with a tubular such as a tubular containing a flow of hydrocarbons produced from a drilling operation.

Preferably, the primary magnet comprises an outer magnet capable of providing a substantially homogenous magnet field. Optionally, the primary magnet comprises an outer and inner layer separated by a spacer.

Preferably, the primary magnet is provided with end members on either end which span across said spacer.

Optionally, said spacer comprises a plurality of flat plates located between said outer and inner layers. Alternatively, said spacer comprises a tubular member located between said outer and inner layers.

Preferably, the secondary magnet comprises an electromagnet. Optionally, said electromagnet is provided by gradient coils located therein. Alternatively, said electromagnet is provided by gradient coils located in said spacer.

Typically, the radio frequency transmitter and radio frequency receiver are provided by a combined transmission and reception coil.

Preferably, the combined transmission and reception coil is provided in a coil housing located on the inner bore of the apparatus. Alternatively, the combined transmission and reception coil is provided in said spacer.

Preferably, the apparatus is adapted for use in a sub sea environment. Alternatively, the apparatus may be used downhole in a wellbore.

BRIEF DESCRIPTION OF THE DRAWINGS

Embodiments of the measurement apparatus in accordance with the present invention will now be described, by way of example only, with reference to the accompanying drawings in which:—

DETAILED DESCRIPTION OF THE PREFERRED EMBODIMENTS

Figure 1:
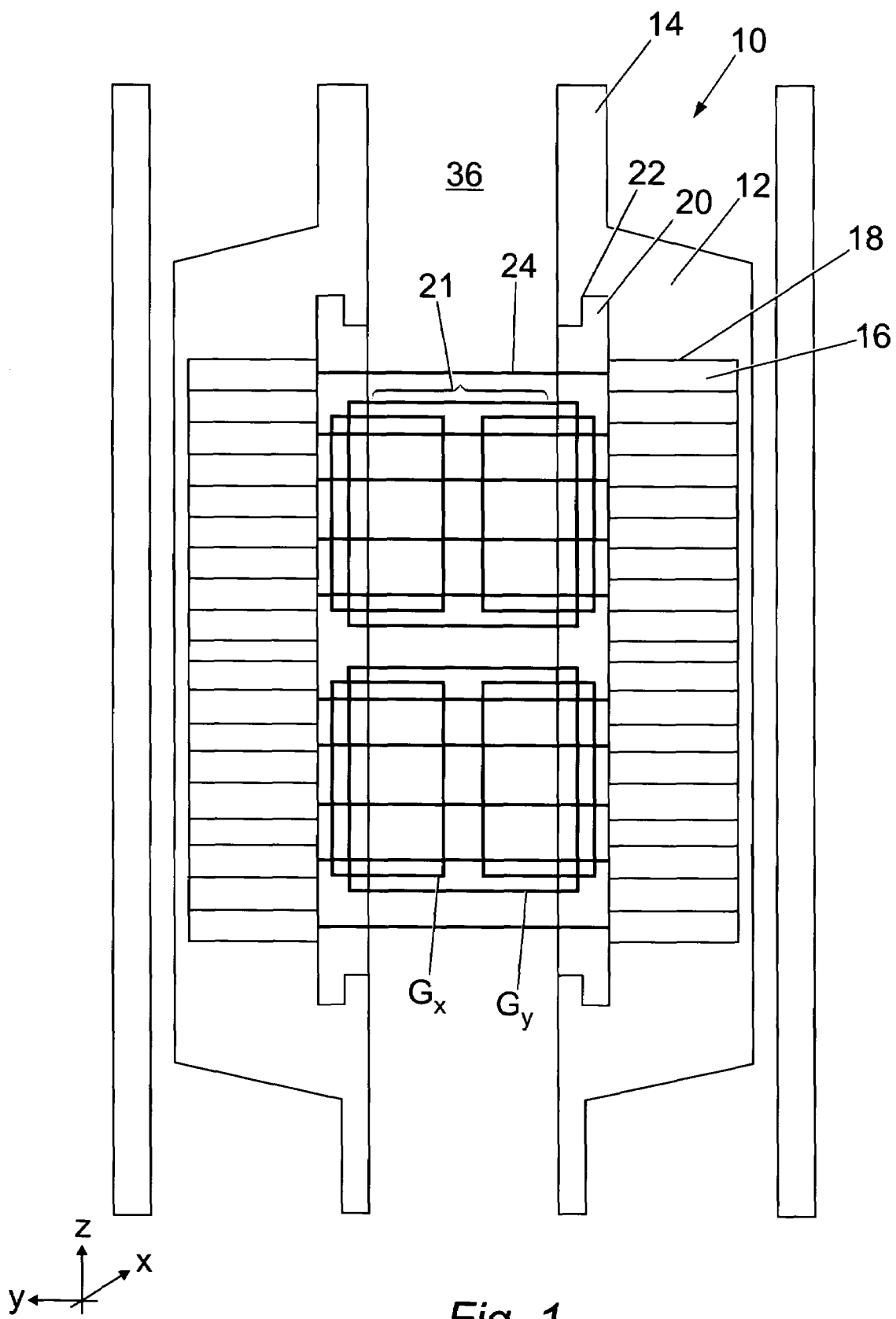
FIG. 1 is a transverse side view of a first embodiment of the apparatus according to the present invention.
Figure 1A:
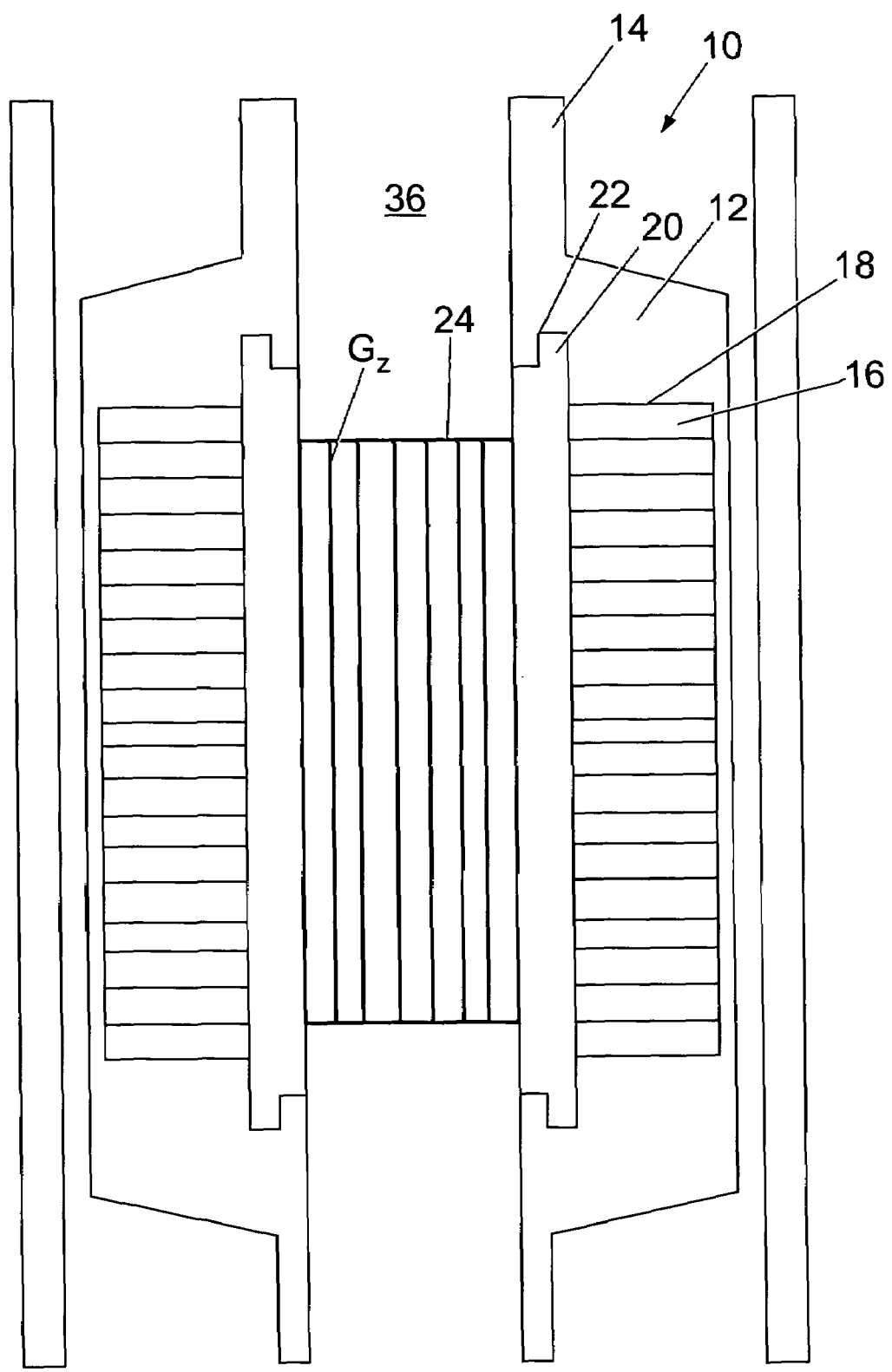
FIG. 1a is a transverse side view of the apparatus of FIG. 1 showing magnetic gradient coils which act in the direction of the z-axis with respect to the reference axes indicated on FIG. 1.
Figure 2:
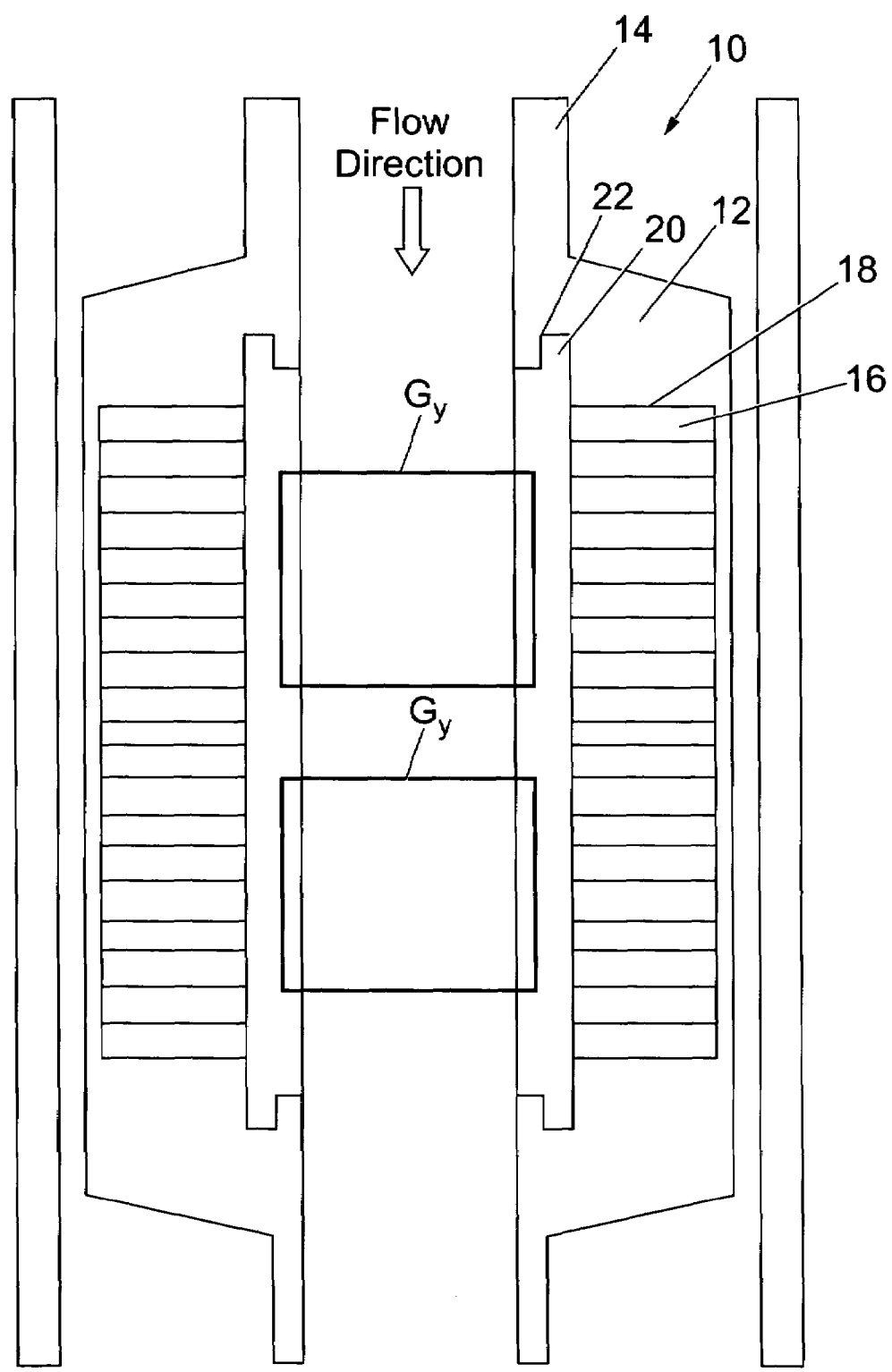
FIG. 2 is a transverse side view of the apparatus of FIG. 1 showing magnetic gradient coils which act in the direction of the y-axis with respect to the reference axes indicated on FIG. 1.
Figure 3:
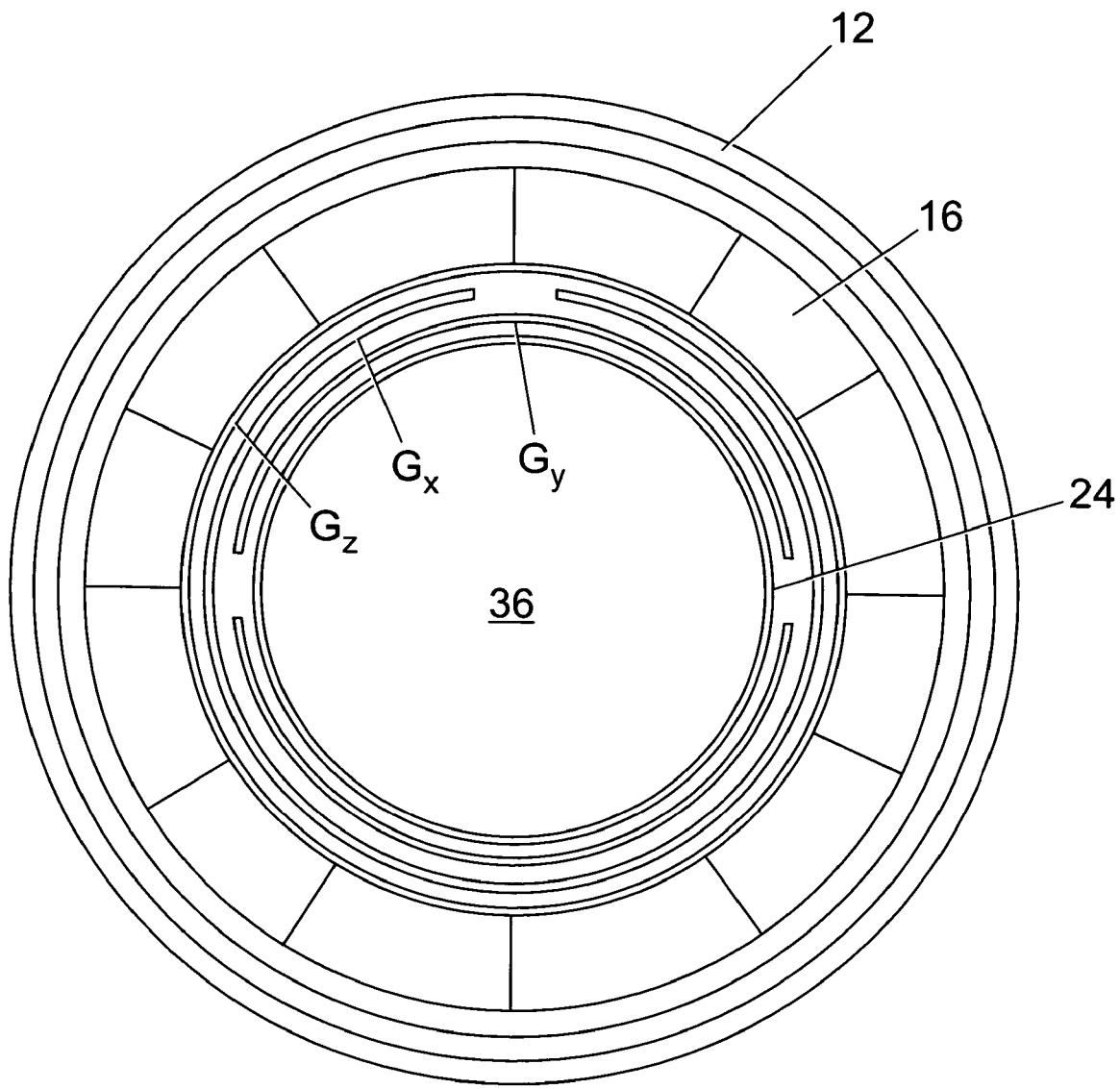
FIG. 3 is a cross sectional view of the apparatus of FIG. 1 showing the components of the magnetic gradient coils which act in the x, y and z directions with respect to the reference axes indicated on FIG. 1.
Figure 4:
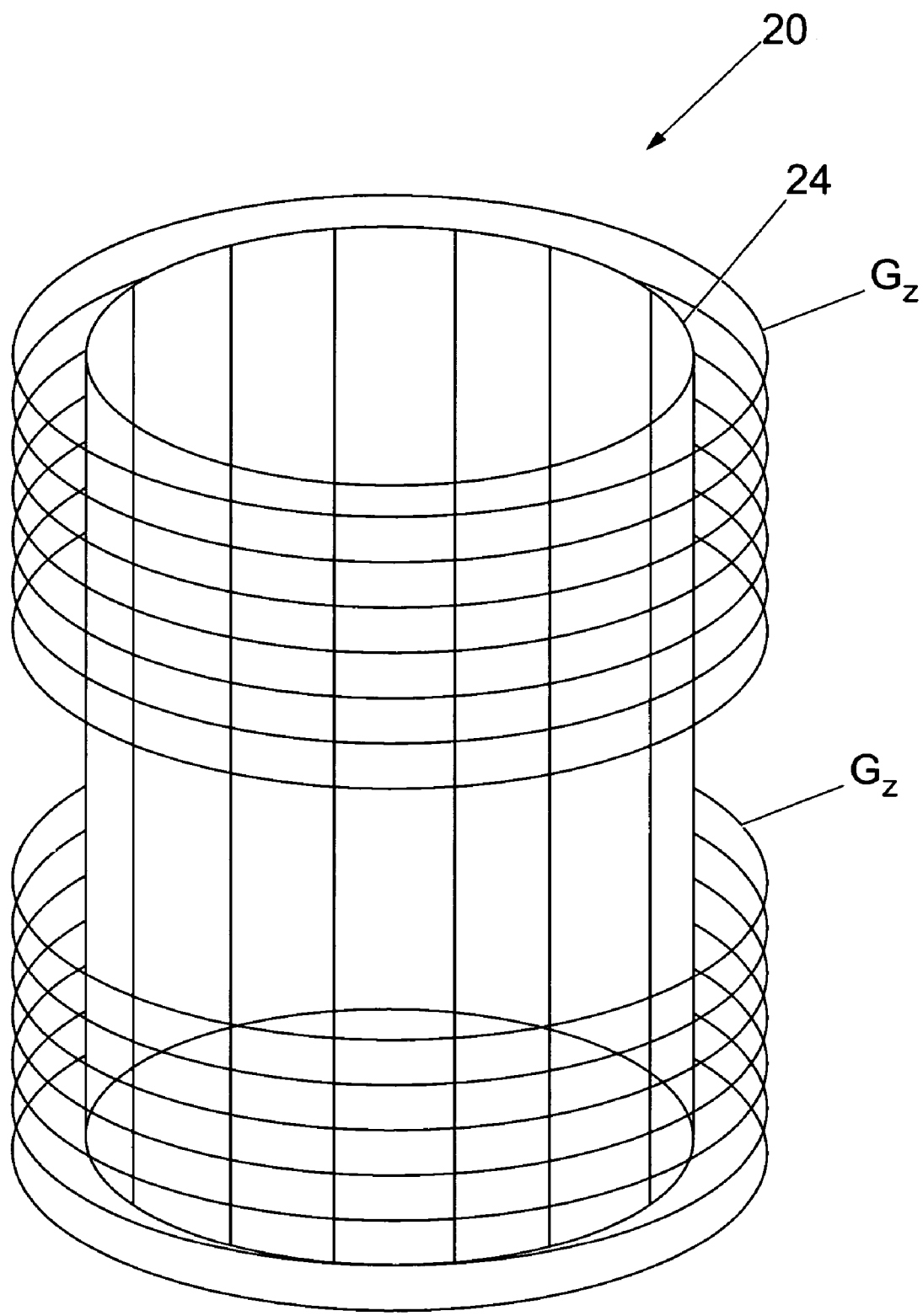
FIG. 4 is a schematic view of the component of the gradient coils which act in the z-axis direction with respect to the reference axes of FIG. 1, arranged around combined transmission and reception coils in accordance with the first embodiment of the present invention.
Figure 5:
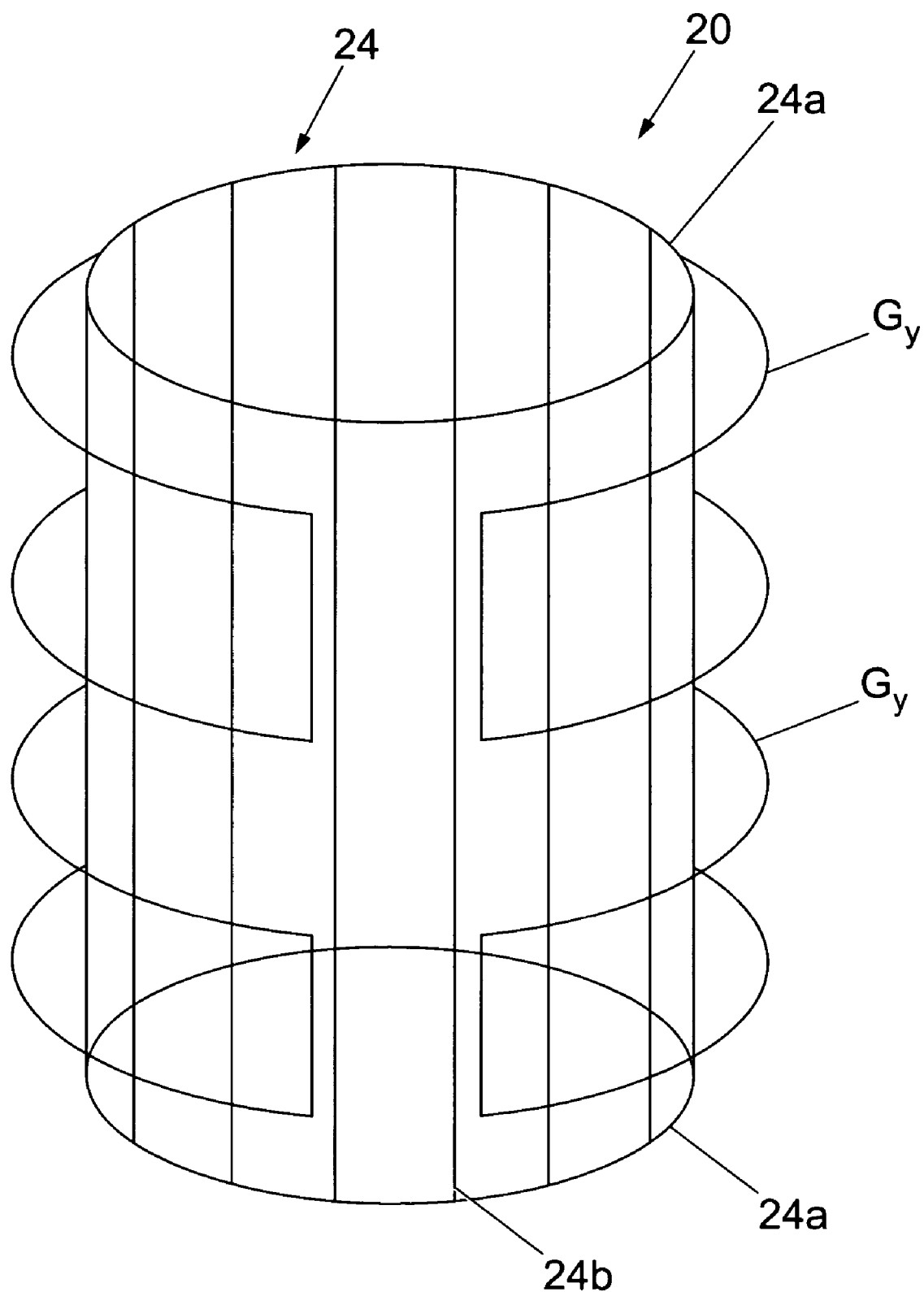
FIG. 5 is a schematic view of the gradient coils which act in the y-axis direction with respect to the reference axes of FIG. 1, arranged around combined transmission and reception coils in accordance with the first embodiment of the present invention.

Referring to FIG. 1 the apparatus 10 in accordance with the first embodiment of the present invention comprises an outer housing 12 which surrounds a section of a fluid flow pipe 14, such as production tubing, by locking thereto via a suitable locking mechanism. Inside the housing 12 is located a primary permanent magnet 16 in an outermost recess 18 and a secondary electromagnet housing 20 located in an innermost recess 22. The electromagnet housing 20 has located within it an electromagnet 21 which comprises electromagnet coils Gx, Gy and (as shown in FIG. 1a Gz). Combined transmission and reception coils 24 are also provided within the inner diameter of the electromagnet housing 20.

Outer housing 12 provides magnetic shielding which ensures minimal leakage of magnetic field outside the apparatus 10, and provides safe handling of the tool. This also improves the signal transmission and reception performance of the coils 24 by minimising interference from surrounding radio signals such as FM radio signals. Housing 12, in the present embodiment, comprises low permeability iron, (typically μr<1.00) which provides the main outer body of the apparatus. The material is typically around 10 mm thick around the mid portion of the apparatus 10 and thicker toward the ends of the apparatus 10, typically up to a thickness of around 60 mm. The skilled reader will realise that different thickness and material may be used in the housing 12 in order to suit the particular application.

Figure 6:
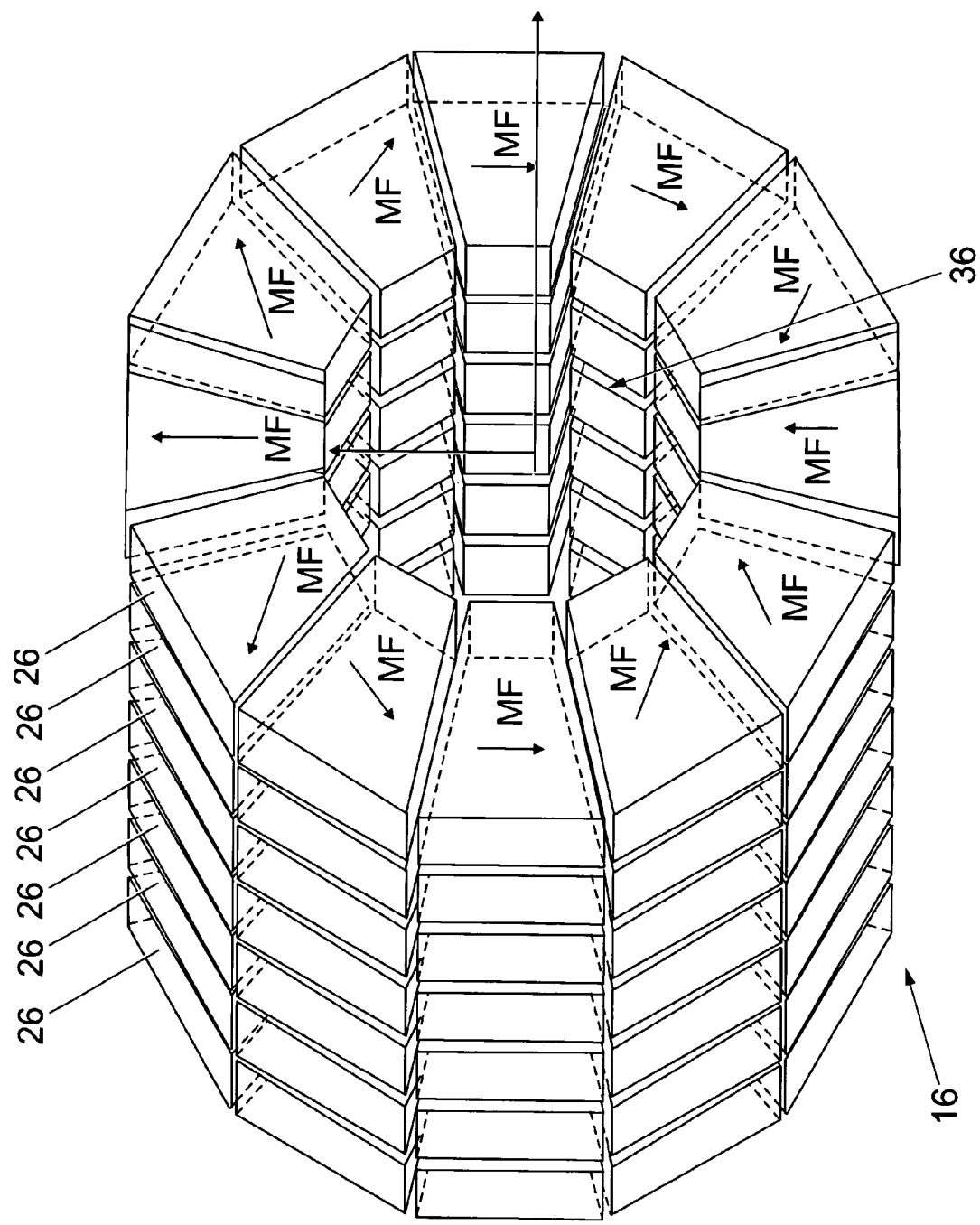
FIG. 6 is an illustration of the preferred magnetic field orientation in order to produce the homogeneous magnet used in accordance with the present invention.
Figure 8:
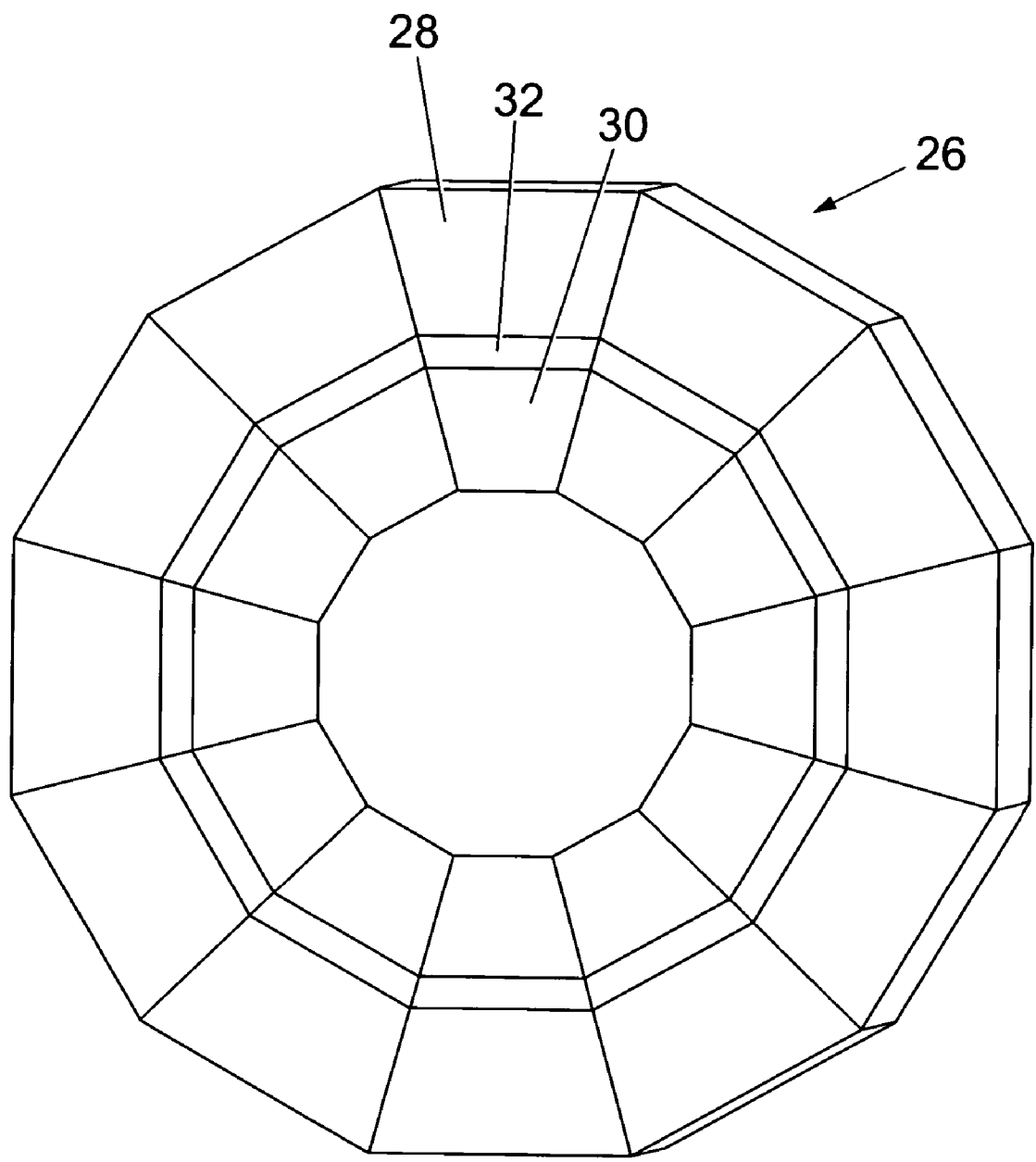
FIG. 8 is a schematic cross sectional diagram of the primary magnet composition used in accordance with the present invention.
Figure 9:
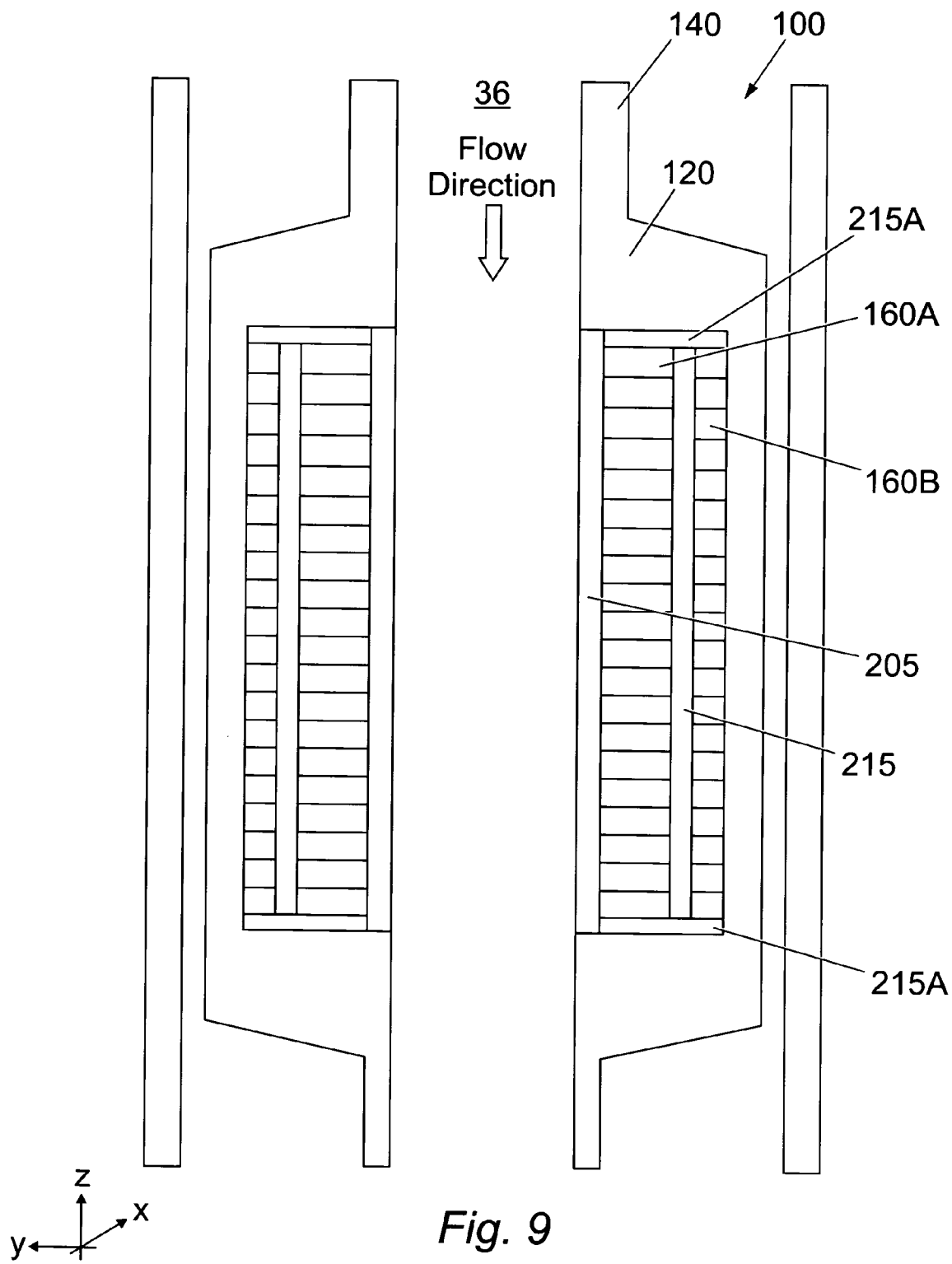
FIG. 9 is a transverse side view of a second embodiment of the apparatus according to the present invention without the gradient and transmission coils shown.

Referring particularly to FIGS. 6 and 8, the primary permanent magnet 16 comprises a number of concentrically arranged magnetic cells 26 which are stacked together. Each magnetic cell 26 comprises a number of outer segments 28 (FIG. 8) arranged adjacent a number of inner segments 30 such that a circumferential band of inner segments 30 are arranged within a circumferential band of outer segments 28. Flat plates 32 are positioned between the circumferential band of outer segments 28 and the circumferential band of inner segments 30 such that a circumferential band of plates 32 is located between the outer segments 28 and the inner segments 30. The plates 32 are typically formed of an iron based material having a permeability of greater than 1000.

Aperture 34 is provided in the centre of each cell 26 to allow the flow of fluid therethrough as will be discussed subsequently. When the cells 28 are stacked together they form a throughbore 36 (as shown in FIG. 6) along the length of the magnet 16. The iron plates 32 ensure that the resultant magnetic field produced by inner segments 30 and outer segments 28 is focussed toward the centre of the aperture 34 of each cell and hence along the throughbore 36 of the apparatus 10.

The skilled reader will understand that the term permanent magnet in this context is taken to mean a magnet which provides a constant magnetic field without requiring e.g. an electric current in order to create the magnetic field. In an alternative, the permanent magnet could be an electromagnet which provides a continuous and substantially homogeneous magnetic field.

It should be noted that the direction of the magnetic field vectors (indicated by MF in FIG. 6) of each outer 28 and inner 30 segment is carefully arranged during manufacture in order to create a resultant magnetic field for the magnet 16 which is as close to being homogeneous as possible throughout the throughbore of the magnet 16. This ensures (as far as possible) that the magnetic field present within the throughbore 36 of the magnet 16 remains consistent within the throughbore 36 irrespective of the location within the throughbore 36 that the magnetic field is experienced. Typically, the required homogeneity is in the region of around 1.0 ppm. This is important in order to ensure accurate measurements are possible using the apparatus 10 in conjunction with the NMR techniques as will be discussed subsequently.

The secondary electromagnet housing 20 is provided with a combined transmission and reception coil 24 which is capable of both transmitting a radio frequency pulse and detecting the radio frequency emitted by nuclei excited by such a radio frequency pulse. In the embodiment shown in the Figures, the coil 24 comprises a pair of circular loops 24a at the top and bottom of the coil 24 connected by circumferentially spaced connecting coils 24b to form a "birdcage" configuration. This provides the apparatus 10 with the ability to both transmit a radio frequency pulse evenly throughout the throughbore 36 and competently detect radio frequency signals emitted by nuclei at any location within the throughbore 36 of the apparatus 10. Rather than a "birdcage" configuration the coils may be arranged to provide a "saddle coil" configuration depending upon the application.

Figure 7A:
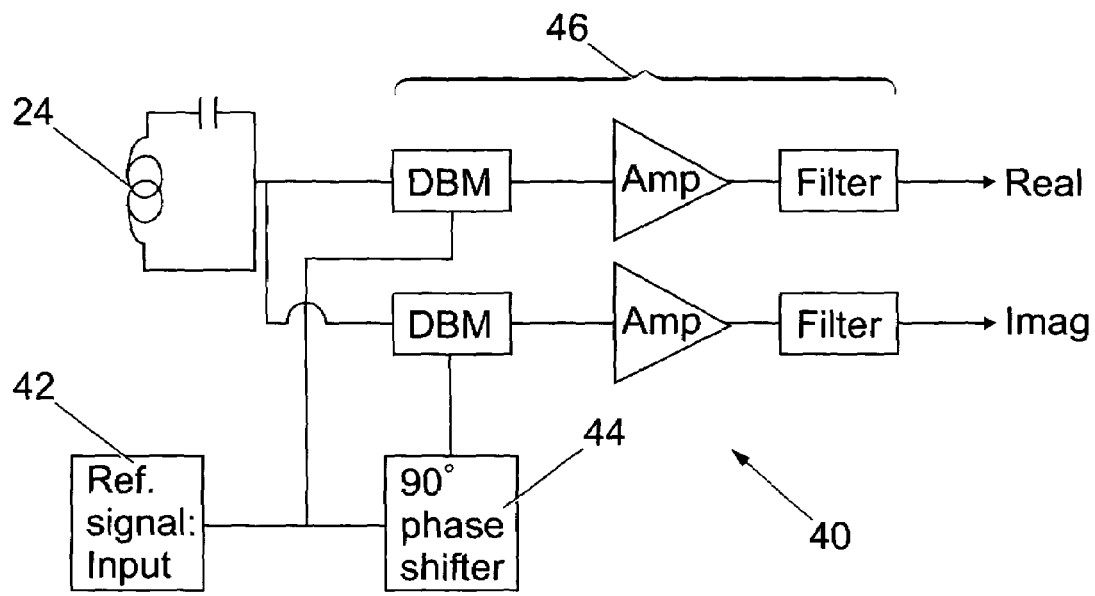
FIG. 7a is a schematic circuit diagram showing the interaction between the various components of the receiving circuit of the combined receiving and transmission coils.
Figure 7B:
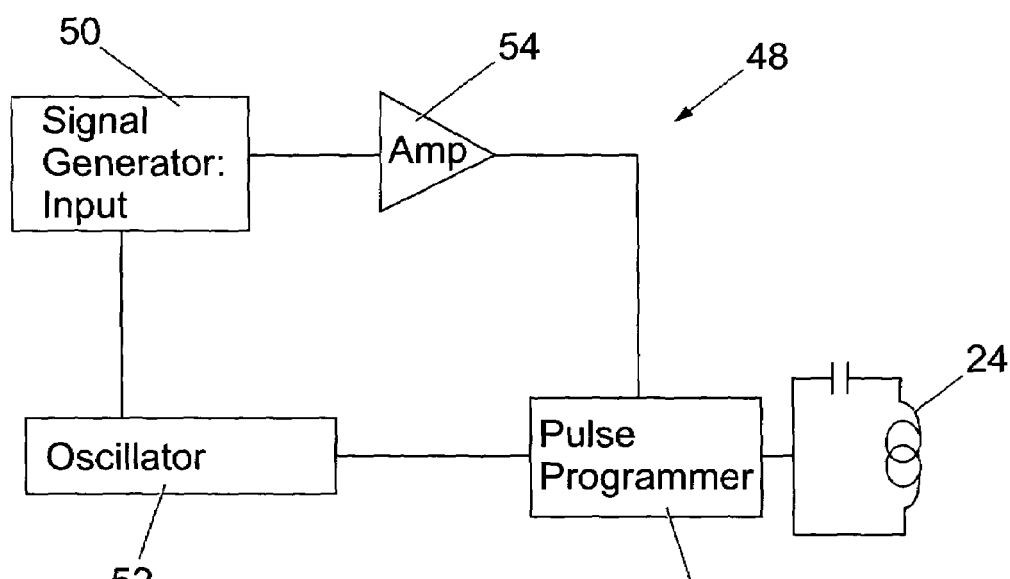
FIG. 7b is a schematic circuit diagram showing the interaction between the various components of the transmitting circuit of the combined receiving and transmission coils.

Referring to FIG. 7a, the receiver circuit 40 of the combined transmission and reception coils 24 comprises a reference signal input generator 42 and a 90° phase shifter 44 connected to a standard amplification and filtering system 46 in order to provide a real and imaginary output signal as a result of the signal received from the coil 24. Referring to FIG. 7b, the transmitter circuit 48 of the combined transmission and reception coils 24 comprises a signal generator input module 50 and an oscillator 52 which are linked to an amp 54 and a pulse programmer 56 in order to transmit the required radio frequency through coil 24. Though illustrated separately in FIGS. 7a and 7b, it will be understood that these circuits may be combined or integrated in order to provide the required transmission and reception capability of combined transmission and reception coils 24.

The secondary electromagnet housing 20 provides the magnetic gradient using coils Gx, Gy, and Gz which selectively (depending upon whether the electromagnet is on or off) provide a graduated magnetic field within the throughbore 36 of the apparatus in the x, y, and z directions respectively indicated by the reference axes R in FIG. 1. This arrangement provides the graduated magnetic field required by the flow rate calculation process described subsequently.

The profile of both the primary permanent magnet 16 and the secondary electromagnet 20 are arranged in the present embodiment, such that they can be housed within the outermost recess 18 and innermost recess 22 respectively in order to maintain a consistent diameter of throughbore 36 through the apparatus 10 such that disturbance of the fluid flowing from the pipe 14 through the apparatus 10 is minimised.

A second embodiment of the present invention having a number of modifications will now be described. Many components of the second embodiment are the same as those described in relation to the first embodiment. Such components will not be described any further. In addition, a number of components in the second embodiment correspond to similar components previously described in relation to the first embodiment, and where this applies, similar reference numerals will be used.

Referring to FIGS. 9 to 13, the apparatus 100 in accordance with the second embodiment of the present invention comprises an outer housing 120 surrounding a primary magnet 160. Primary magnet 160 has an inner ring 160A and an outer ring 160B. A secondary electromagnet is provided in housing 215 as discussed subsequently. Transmission/reception coil housing 205 is provided on the internal bore of the apparatus 100. The housing 205 is typically made of a material such as Poly-Ether-Ether-Ketone (PEEK) or a nickel alloy such as Inconel®. The use of Inconel® is preferable here due to the pressure rating requirement of the apparatus. Achieving the required pressure rating using (PEEK) would require the housing 205 to have a very thick wall (in the region of 20 mm). Such a wall would degrade the magnet field strength at the centre of the flow path since magnet strength decreases with radial distance from the magnet. The thickness required using Inconel® is much less (in the region of 7 mm). In addition, the use of Inconel® (which has permeability comparable with free space ($\mu r \simeq 1$)), concentrates the magnetic field into the flow path, thereby increasing the magnetic strength homogeneity.

The housing 205 in the present embodiment is provided with recessed tracks (not shown) which are machined onto the outer surface of the housing 205 during manufacture. Additional shapes may also be machined onto the outer surface in order to accommodate components such as the transmission and reception coil capacitors used in the transmission and reception circuit. Electrical insulation (not shown) such as adhesive insulant is also provided between the transmission/reception coil and the housing 205.

Figure 10:
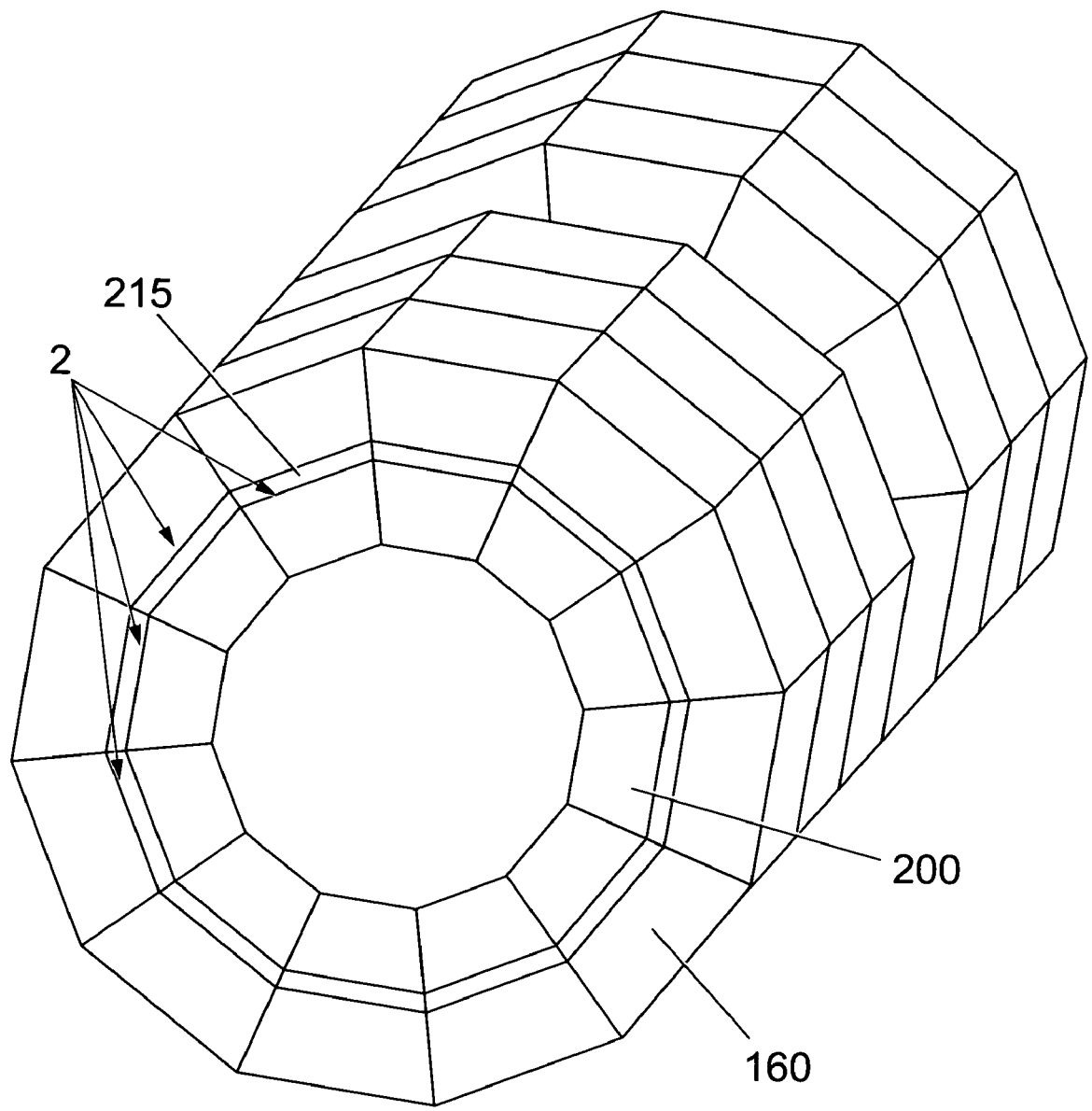
FIG. 10 is a schematic perspective view of the magnet configuration used in the apparatus of FIG. 9.
Figure 11:
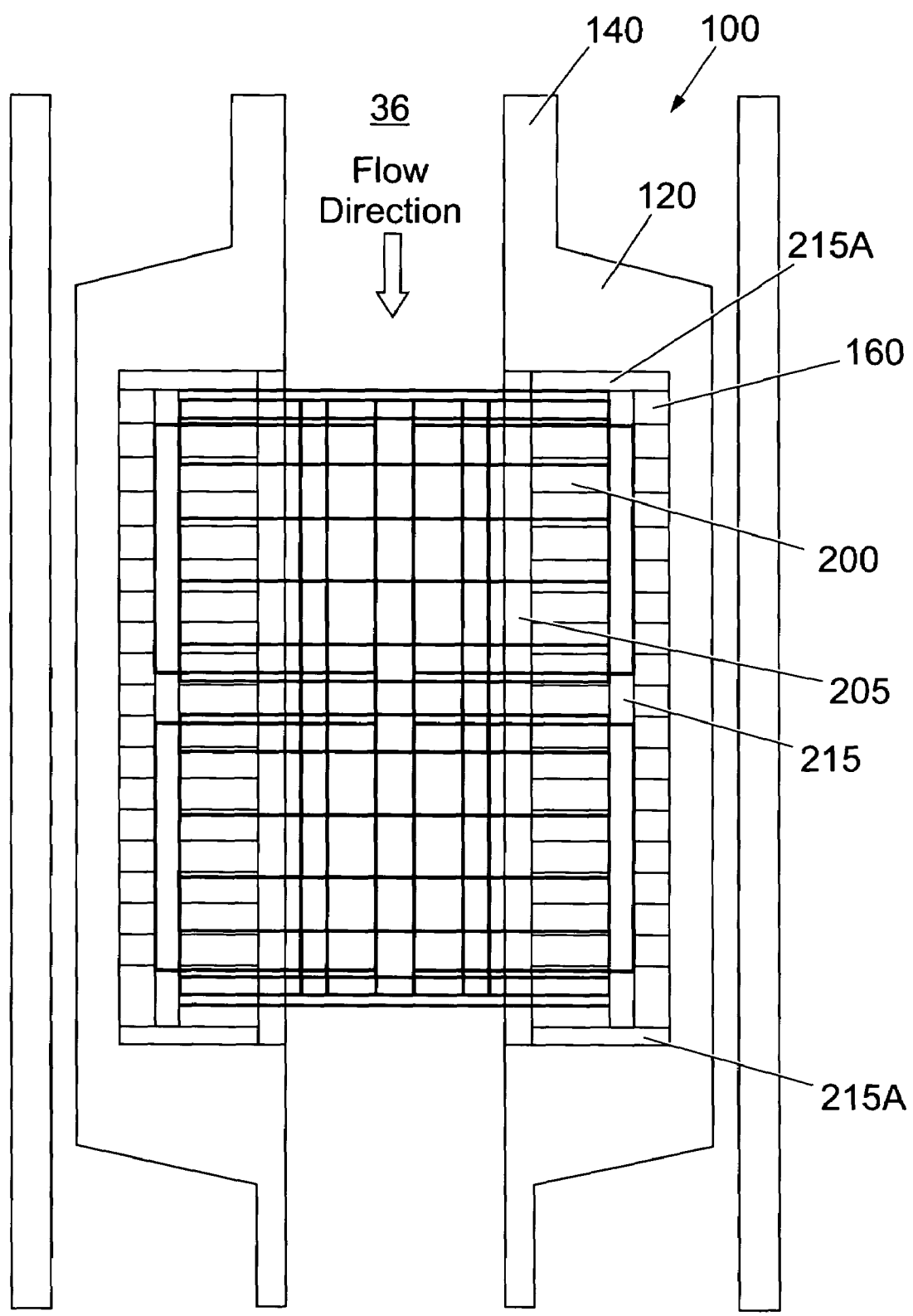
FIG. 11 is a transverse side view of the apparatus of FIG. 9 showing the gradient and transmission coils.

In further contrast, with the first embodiment, the apparatus 100 has gradient coils Gx, Gy, Gz mounted in tubing 215 between the primary magnet portions 160A and 160B. This separates the magnets 160A and 160B from one another which increases the combined efficiency of the magnets in producing a high strength homogeneous magnetic field in the flow path. The tubing 215 also provides mechanical support to retain the primary magnet and to provide support against the pressure exerted from the flow. In the present embodiment, the tubing 215 is made from high permeability iron and is dodecagonal in shape (as shown in FIG. 10). A pair of axial end members 215A are also provided in order to provide a magnetically permeable path for the magnetic field.

Figure 12:
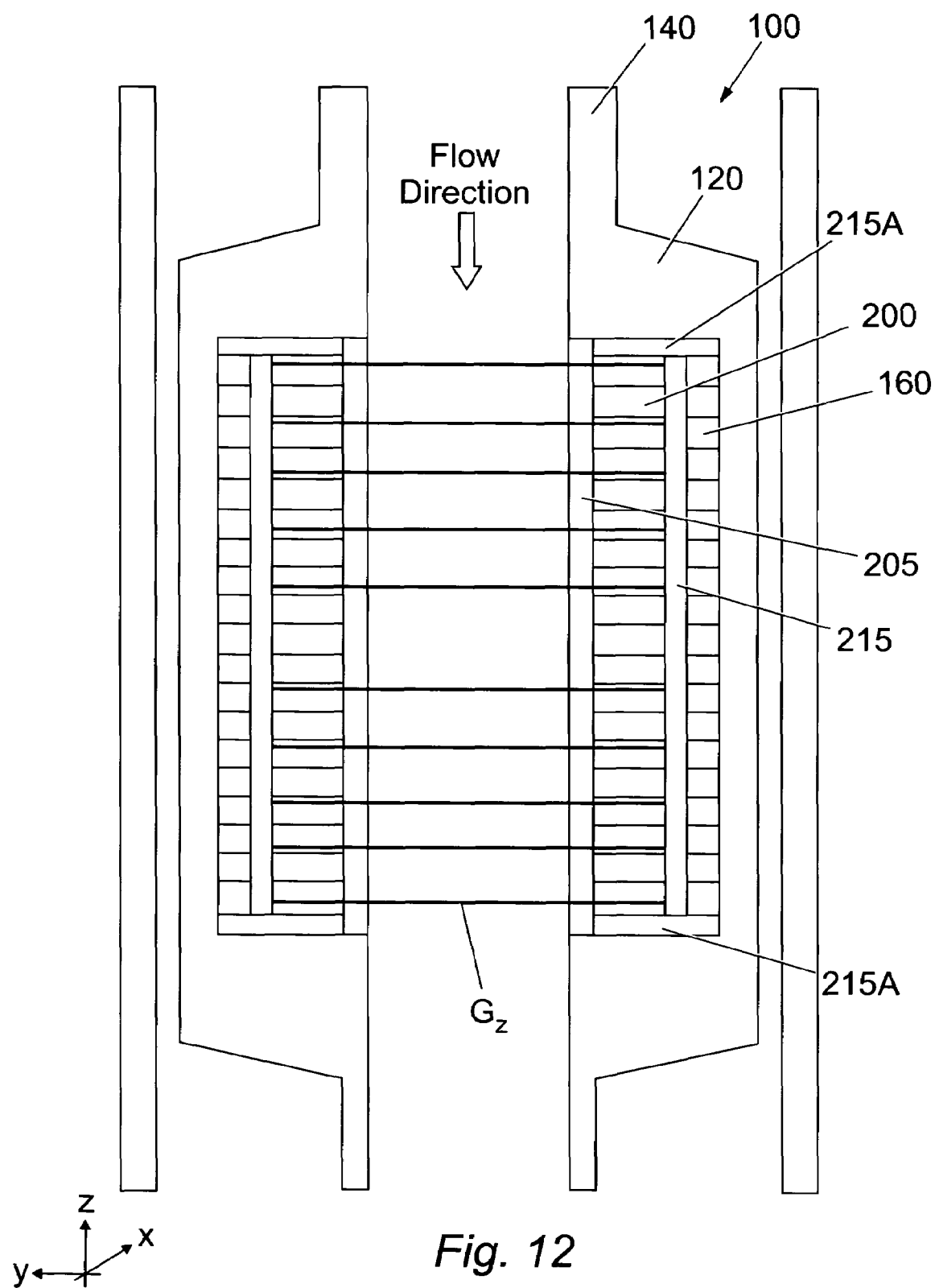
FIG. 12 is a schematic view of the component of the gradient coils of FIG. 10. which act in the z-axis direction.
Figure 13:
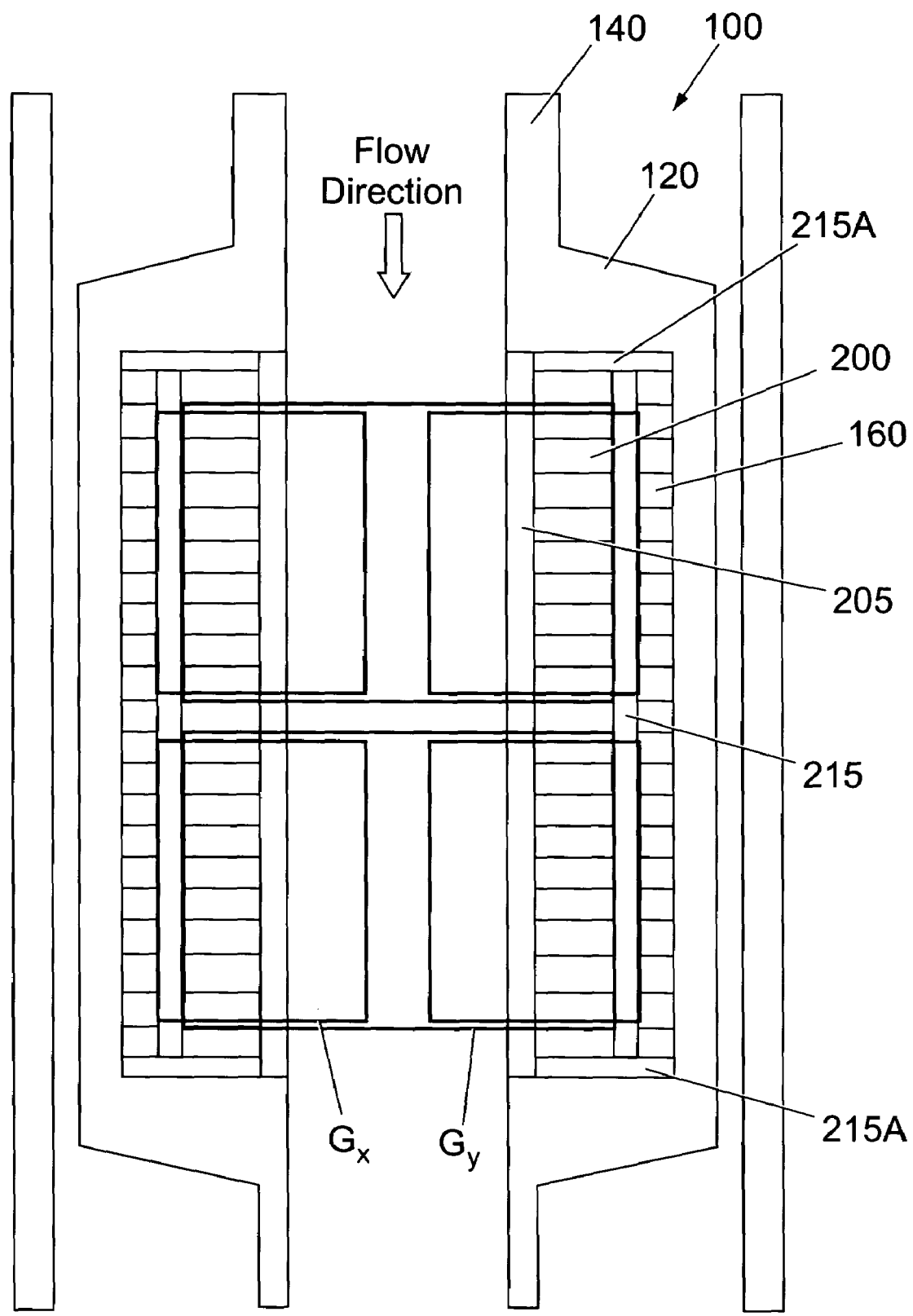
FIG. 13 is a schematic view of the component of the gradient coils of FIG. 10 which act in the x and y-axis directions.

As seen in FIG. 12, tubing 215 houses the axial gradient coil along the flow path (Gz) n the inner surface and the orthogonal gradients (Gx and Gy) on the outer surface (see FIG. 13). Again these coils are provided in recessed tracks on the tubing 215 and are insulated from the tubing itself using adhesive insulant. The gradient coils are capable of imparting a variable magnetic field as discussed subsequently and in this regard can be considered as an electromagnet.

The tubing 215 is provided with a tubular inner diameter in order to provide minimal frictional losses to the fluid passing therethrough, and a dodecagonal outer surface which allows the tubing to fit within the rings of magnets.

In use, each embodiment of the apparatus operates in an identical fashion by 10 utilising Nuclear Magnetic Resonance (NMR) techniques in order to determine the volume fraction of multiphase flow produced from a wellbore. In addition to determining the fraction of each phase present in the flow, the invention may also be used to determine the rate of fluid flowing from the wellbore. The embodiments described determine the phase fraction of fluid containing oil, gas and water phases; however, it will be understood by the skilled reader that further and/or different phases could be determined using the apparatus and method described.

For clarity the phase fraction analysis process will firstly be described followed by a description of the flow measurement process; however, it should be noted that both of these processes may be effectively carried out simultaneously by configuring the control system of the apparatus 10 to rapidly alternate between fraction analysis mode and flow measurement mode. This alternation between modes is typically performed at a rate of approximately one second for each mode i.e. the control system will allow the fraction analysis mode to operate for one second and then allow the flow measurement mode to operate for one second before switching back to the fraction analysis mode and so on as required. The skilled reader will note that this time may be altered to suit the specific situation.

The method of using the first embodiment of the apparatus will be described in the following description; however, the skilled reader will realise that either embodiment could be used.

In the embodiment shown, the apparatus 10 is installed in-line with a fluid flow pipe 14. As produced fluids flow into the apparatus 10, they enter the substantially homogeneous primary magnetic field generated by primary magnet 16. This causes any atomic nuclei having a non-zero magnetic moment present in the fluids flowing through the apparatus 10 to align themselves with the axis of the primary magnetic field. Fluids having a non-zero magnetic moment include $^1H$, $^{13}C$, $31P$ and $^{15}N$. In this embodiment (and in many NMR applications in general) $^1H$ is the most commonly measured of these since it is naturally present in hydrocarbons such as those produced from wellbores. The nuclei of flow within the throughbore 36 of the apparatus 10 including water, oil and gas are now aligned with the direction of the primary magnetic field.

A radio frequency (RF) pulse signal is now transmitted into the throughbore 36 using the transmission circuit 48 of the combined transmission and reception coils 24. The frequency of the RF pulse will be transmitted at a frequency which is known to excite the atomic nucleus of $^1H$ (typically in the region of between 40-45 MHz for a 1 Tesla static magnetic field such that it resonates at its natural resonant frequency (this is known as the larmour frequency). This ensures that any $^1H$ nuclei present in fluid flowing through the throughbore 26 will resonate in response to the RF pulse signal. The frequency (v) required to resonate the nuclei may be determined using the following equation:

$$v = \frac{\gamma B}{2\pi} \qquad \text{Eqn. (1)}$$

where γ is the gyromagnetic ratio of the nucleus and B is the magnetic field.

While resonating, the nuclei emits a radio signal at a frequency corresponding to its resonating frequency.

The frequency at which the nuclei present in the fluid flow resonate after having being excited by the RF pulse signal is now detected by the receiver circuit 40 of the combined transmitter and reception coils 24. In a mixture of phases such as in the present embodiment, the resonance described provides molecular information such as the bond type and the environment surrounding the nuclei. From this, the ratio of the signal being received from the resonating nuclei to the background frequency of the RF pulse may be calculated. The skilled reader will understand that this value is known as Chemical Shift and is measured in parts per million (ppm).

The chemical shift (δ) recorded by the apparatus may now be used to determine the ratio of oil and gas (combined) to water using the following equation:

$$\delta = \frac{v_{sample} - v_{reference}}{v_{reference}} \times 10^6 \, ppm \qquad \text{Eqn. (2)}$$

In this regard, the separation between the phases is increased by ensuring that good magnetic field homogeneity is provided by the primary permanent magnet 16 in order to produce a relaxation time graph peak with a small bandwidth.

However, as stated previously it is desirable to be able to measure the ratio of oil to gas also in order to determine the ratio of oil, gas and water in the multiphase fluid without assuming that there are no other phases present. It is not possible to detect the ratio of oil to gas using the chemical shift method since the chemical shift between oil and gas nuclei is too small to measure accurately. Therefore it is necessary to determine the ratio of oil to gas by comparing the $T_1$ relaxation times (described subsequently) of each hydrocarbon. This is possible since the $T_1$ relaxation times of gaseous hydrocarbons are longer compared to the $T_1$ relaxation times of liquid hydrocarbons.

In addition to causing the nuclei of each phase to resonate, the energy supplied by the RF pulse signal from the combined transmission and reception coil 24 causes the nuclei of each phase to be knocked off their previous alignment with the primary magnetic field. After the RF signal has been pulsed, the spins (nuclei which have been subjected to a magnetic field) will tend to relax back to their state of equilibrium in which they are re-aligned along the primary magnetic field. The time taken for the spins to relax back to their state of equilibrium after the RF signal has been pulsed off is known as the $T_1$ relaxation time of the nuclei.

It is possible to measure the $T_1$ relaxation times of the oil and gas using the apparatus 10 by monitoring the angle through which the nuclei of each phase of the flow is tilted with respect to the primary magnetic field at any given time (which must be less than the relaxation time) after the RF signal has been pulsed. This is done by measuring the time taken for the magnitude of the radio frequency received from the nuclei to reach a maximum value in the direction of the primary magnetic field and the time taken for a minimum value in the direction orthogonal to the primary magnetic field direction, which may be performed using the combined transmission and reception coils 24. This results in two distinct $T_1$ relaxation times being detectable; one for the oil phase and one for the gas phase. The proton density (PD) of each hydrocarbon phase is now calculated by integrating the area under each peak of the accumulated $T_1$ relaxation time density. The graph is derived by applying an inverse algorithm to the $T_1$ relaxation time measurement extracted using an inversion recovery sequence. Using the proton density measurement the volume fraction is now calculated using the following equation:

$$V = \frac{MW_s}{\rho_s} \times \frac{1}{Av} \times \frac{PD}{\alpha R_{1H}} \qquad \text{Eqn. (3)}$$

where $MW_s$ is the molecular weight, $\rho_s$ is the density of the sample, Av is the Avogadro number, PD is the proton density, $\alpha$ is the natural abundance of $^1H$ and $R_1H$ is the number of $^1H$ for 1 molecule of the phase.

The sequence applied here is such that the required measurement time is less than the transit time ($\tau$) of the flow. The method of determining the proton density is performed using a 1 Dimensional hydrogen nuclei (1D-1H) sequence in combination with an inversion recovery sequence for $T_1$ measurement and Carr-Purcell Meiboom-Gill (CPMG) sequence for $T_2$ measurement.

However, the above merely returns values for the volume of the relevant phases and, as previously mentioned, it is the phase fraction that is required. In order to calculate the phase fraction, the following equation may be used:

$$\frac{V_1}{\sum_{i=1}^{n} V_i} = \frac{\frac{MW_1}{\rho_1} \times \frac{PD_1}{R_{1HI}}}{\sum_{i=1}^{n} \left( \frac{MW_i}{\rho_i} \cdot \frac{PD}{R_{1Hi}} \right)} \qquad \text{Eqn. (4)}$$

where n is the number of phases present in the sample.

It should be noted that in a sample containing just two phases (a and b), the equation can be simplified to:

$$\frac{V_a}{V_a + V_b} = \frac{1}{1 + \frac{MW_b \times \rho_a \times PD_b \times R_{1H_a}}{MW_a \times \rho_b \times PD_a \times R_{1H_b}}} \qquad \text{Eqn. (5)}$$

Each of the fractions of oil, gas, and water have therefore been calculated using the apparatus 10 without (as in some previous systems) requiring to assume that once the ratios of two phases in the flow have been calculated the third makes up the rest of the fluid.

The method and apparatus for determining the flow rate of the fluid flow will now be described.

Now that the ratio of each phase has been calculated, the $T_1$ relaxation time of each phase is known. The embodiment shown is capable of employing two alternative methods of calculating the flow rate of each phase through the apparatus 10. The first is based upon the Time of Flight (TOF) of the spins along the apparatus 10. In this method a pulse signal is applied in a 'slice' at a first location along the throughbore 36 of the apparatus 10 in order to tilt the nuclei at that location. A detection area is then monitored downstream from the location at which the pulse signal was applied. The resultant NMR signal received by the reception circuit 40 of the combined transmission and detection coils 24 will now be increased by every fully tilted spin entering the detection area and will be decreased with every fully tilted spin leaving the detection area. The overall net signal can therefore be related back to the flow of phase through the apparatus. This allows the velocity of the flow (v) to be calculated using the transit time ($\tau$) and the distance of the detection area (d) using the following equation:

$$\tau = \frac{d}{v} \qquad \text{Eqn. (7)}$$

The second alternative method of measuring the flow through the apparatus 10 uses the gradiated magnetic field provided by the secondary electromagnet 20. A gradient echo sequence is imparted on the flow such that the nuclei of the flow rotate about their axes. In a stationary flow this results in no net accumulation of phase signals since the nuclei would experience the same balanced gradient with respect to time. However, in a dynamic flow the magnetic field experienced by the nuclei will change as the nuclei flow along the throughbore 36 of the apparatus 10 due to the magnetic field gradient provided by electromagnet 20. This variation of magnetic field, dependent upon the movement of the flow along the throughbore 36 of the apparatus 10, results in an accumulation of phase signal. This is dependent upon the velocity of the flow through the apparatus 10 and the strength and duration of the magnetic filed gradient supplied by the electromagnet 20. The accumulation in phase ($\phi$) which may be directly correlated to the velocity of the flow is given by:

$$\phi = \gamma B_0 \int dt + \gamma \int n(t) G_n(t) dt \qquad \text{Eqn. (8)}$$

where $B_0$ is the magnetic field provided by the primary magnet, n represents the position of the spins within the through bore in either the x, y, or z axes (as shown in FIG. 1) and $G_n$ is the magnitude of the magnetic field gradient being applied by the electromagnetic 20 in the n-axis direction.

The method described previously allows both the flow rate and proportion of each phase to be calculated using a single apparatus 10. Furthermore, the system and apparatus described does not require users of the apparatus to be safeguarded from levels of operational danger other than that normally expected in such oil and gas exploration operations. Specifically, the apparatus and method described does not require the user to be protected against e.g. radiation and biological hazards.

Modification and improvements may be made to the foregoing without departing from the scope of the invention, for example:—

The dimensions of the apparatus may need to be altered during the manufacturing stage dependent upon the particular downhole or subsea conditions it is to be used. In this regard, the space requirements of the components must be balanced with the accuracy of measurements required; this is particularly relevant for the primary magnet 16 and the electromagnet 20.

The apparatus described above may be used downhole, or in a wellbore or in-line with any portion of the production tubing. Alternatively the apparatus may be used off site as an off-site measurement and analysis tool.

What is claimed is:

1. A method of determining flow characteristics of a multiphase fluid along a flow path comprising:
    imparting a primary magnetic field on the multiphase fluid flow to align nuclei of the multiphase fluid with a direction of the primary magnetic field;
    imparting a radio frequency signal on the multiphase fluid flow to excite the nuclei of the multiphase fluid flow;
    receiving a radio frequency signal emitted by the excited nuclei of the multiphase fluid to derive a Nuclear Magnetic Resonance (NMR) signal; and
    alternating between a phase ratio mode comprising processing the received radio frequency signal to determine a ratio of at least one phase with respect to another phase in the multiphase fluid, and a phase flow mode comprising imparting a secondary magnetic field in a region of the fluid flow which varies in magnitude along a length of the fluid flow path to provide a variation in the magnetic field experienced by the nuclei of the multiphase fluid dependent upon their position along the flow path to determine velocity of the multiphase fluid flow.

2. A method according to claim 1, further comprising detecting a flow characteristic of a hydrocarbon in the fluid flow.

3. A method according to claim 1, further comprising imparting the radio frequency on the multiphase flow by a transmission coil.

4. A method according to claim 1, further comprising receiving the radio frequency emitted by the excited nuclei by a reception coil.

5. A method according to claim 4, further comprising imparting and receiving the radio frequency signal by a combined reception and transmission coil.

6. A method according to claim 1, further comprising transmitting the radio frequency signal at a frequency which is known to excite the nuclei of the phases of the multiphase fluid.

7. A method according to claim 1, further comprising distinguishing peaks caused in an NMR spectrum by the radio frequency signal emitted by the nuclei of two or more phases of the multiphase fluid.

8. A method according to claim 7, further comprising numerically integrating an area under a peak of the NMR spectrum to ascertain a proton density of a phase in the fluid flow.

9. A method according to claim 7, further comprising calculating a volume fraction (V) of the phase using the proton density measurement in accordance with the following equation:

$$V = \frac{MW_s}{\rho_s} \times \frac{1}{Av} \times \frac{PD}{\alpha R_{1H}}$$

where $MW_s$ is molecular weight, $\rho_s$ is density of a fluid sample, $Av$ is Avogadro number, $PD$ is proton density, $\alpha$ is natural abundance of 1H and $R_{1H}$ is number of 1H for 1 molecule of the phase.

10. A method according to claim 1, further comprising calculating a proton density for each phase comprising the fluid flow using the following equation:

$$\frac{V_1}{\sum_{i=1}^{n} V_i} = \frac{\frac{MW_1}{\rho_1} \times \frac{PD_1}{R_{1HI}}}{\sum_{i=1}^{n} \left( \frac{MW_i}{\rho_i} \cdot \frac{PD}{R_{1Hi}} \right)}$$

where n is the number of phases present in the flow.

11. A method according to claim 1, further comprising determining relaxation times of the nuclei of each phase of the multiphase fluid flow to determine the fraction of each phase comprising the multiphase fluid flow.

12. A method according to claim 11, further comprising monitoring a time taken for a magnitude of the radio frequency signal received from the nuclei to reach a maximum value in the direction of the primary magnetic field and monitoring a time taken for the magnitude of the radio frequency signal received from the nuclei to decay to a minimum value in a direction orthogonal to the primary magnetic field.

13. A method according to claim 12, further comprising monitoring a direction from which the radio frequency signal is received from the nuclei by reception coils which are adapted to detect a component of the radio frequency signal emitted from the nuclei in longitudinal and transverse directions with respect to the direction of the primary magnetic field.

14. A method according to claim 1, further comprising selectively imparting a gradient echo sequence on the fluid flow path to determine the flow rate of each phase in the fluid flow path as a result of detecting the accumulated phase shifts caused by the variation of the magnetic field provided by the secondary magnetic field.

15. A method according to claim 14, further comprising calculating the accumulation of the phase shifts using the following equation:

$$\phi = \gamma B_0 \int dt + \gamma \int x(t) G_x(t) dt$$

where $\gamma$ is the gyromagnetic ratio of the nucleus and $B_0$ is the primary magnetic field.

16. A method according to either of claims 14 or 15, when dependent upon claim 5, further comprising imparting the gradient echo sequence on the fluid flow path by way of the combined reception and transmission coil.

17. A method according to either of claims 14 or 15 further comprising pulsing the gradient echo sequence at a rate which allows the relaxation times of the nuclei of each phase to be determined in a length of time which is less than or equal to the length of time taken by the flow to transit through the flow path.

18. A measurement apparatus having a fluid flow path therethrough, comprising:
- a primary magnet configured to impart a magnetic field in a region of the fluid flow path;
- a secondary magnet configured to impart on the fluid flow a magnetic field which varies in magnitude along a length of the fluid flow path in the region of the fluid flow path;
- a transmitter configured to impart a radio frequency signal in the region of the fluid flow path; and a receiver configured to receive a radio frequency signal from fluid present in the fluid flow path for determining phase fraction and flow rate of phases present in the fluid in the flow path.

19. Measurement apparatus according to claim 18, wherein the flow path comprises a through bore in fluid communication with a tubular.

20. Measurement apparatus according to claim 18, wherein the primary magnet comprises an outer magnet configured to provide a substantially homogeneous magnetic field.

21. Measurement apparatus according to claim 20, wherein the primary magnet comprises an outer and inner layer separated by a spacer.

22. Measurement apparatus according to claim 21, wherein the primary magnet is provided with end members on either end which span across the spacer.

23. Measurement apparatus according to either of claims 21 or 22, wherein the spacer comprises a plurality of flat plates located between the outer and inner layers.

24. Measurement apparatus according to claim 21, wherein the spacer comprises a tubular member located between the outer and inner layers.

25. Measurement apparatus according to claim 18, wherein the electromagnet is provided by gradient coils located in the spacer.

26. Measurement apparatus according to 25, wherein the secondary magnet comprises an electromagnet.

27. Measurement apparatus according to claim 25, wherein the electromagnet is provided by gradient coils located in the spacer.

28. Measurement apparatus according to claim 18, wherein the transmitter and the receiver are provided by a combined transmission and reception coil.

29. Measurement apparatus according to claim 28, wherein the combined transmission and reception coil is provided in a coil housing located on an inner bore of the apparatus.

30. Measurement apparatus according to claim 28, wherein the combined transmission and reception coil is provided in a spacer.

* * * * *

UNITED STATES PATENT AND TRADEMARK OFFICE
CERTIFICATE OF CORRECTION

PATENT NO. : 7,501,819 B2  
APPLICATION NO. : 11/233900  
DATED : March 10, 2009  
INVENTOR(S) : Joo Tim Ong Page 1 of 1

It is certified that error appears in the above-identified patent and that said Letters Patent is hereby corrected as shown below:

Column 14, claim 25, lines 8-9, delete "the electromagnet is provided by gradient coils located in the spacer." insert --the secondary magnet comprises an electromagnet.--; and Column 14, claim 26, line 11, delete "secondary magnet comprises an electromagnet." insert --electromagnet is provided by gradient coils located therein.--.

Signed and Sealed this

Twenty-first Day of April, 2009

JOHN DOLL  
*Acting Director of the United States Patent and Trademark Office*